(12) United States Patent
Teshima et al.

(10) Patent No.: US 7,126,452 B2
(45) Date of Patent: Oct. 24, 2006

(54) WIRING STRUCTURE, AND FABRICATION METHOD OF THE SAME

(75) Inventors: Takayuki Teshima, Atsugi (JP); Yasuhiro Shimada, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 55 days.

(21) Appl. No.: 10/986,117

(22) Filed: Nov. 12, 2004

(65) Prior Publication Data
US 2005/0174209 A1 Aug. 11, 2005

(30) Foreign Application Priority Data
Nov. 14, 2003 (JP) ............... 2003-384612

(51) Int. Cl.
*H01F 5/00* (2006.01)
(52) U.S. Cl. .............. 336/200; 336/223; 29/602.1
(58) Field of Classification Search ............ None
See application file for complete search history.

(56) References Cited

U.S. PATENT DOCUMENTS 5,398,400 A * 3/1995 Breen ............... 336/200
5,420,558 A * 5/1995 Ito et al. ............ 336/200
5,475,255 A * 12/1995 Joardar et al. ......... 257/547
6,002,161 A * 12/1999 Yamazaki ............ 257/531
6,879,023 B1 * 4/2005 Gutierrez ............ 257/547
6,903,645 B1 * 6/2005 Mizoguchi et al. ...... 336/200
6,906,610 B1 * 6/2005 Okamoto et al. ....... 336/200

FOREIGN PATENT DOCUMENTS

JP          5-198449       8/1993
JP       2001-250723       9/2001

* cited by examiner

*Primary Examiner*—Anh Mai
(74) *Attorney, Agent, or Firm*—Fitzpatrick, Cella, Harper & Scinto

(57) ABSTRACT

An electrical wiring structure, such as a planar coil, includes a set of wiring formed of an electrical conductor and formed on an insulating surface of a substrate. A dam-up wall structure is provided around an outermost peripheral portion of the set of wiring on the substrate. The dam-up wall structure is electrically disconnected from the set of wiring. An insulating layer is formed over an area from the set of wiring to the dam-up wall structure on the substrate, wherein the dam-up wall structure dams up the insulating layer.

9 Claims, 5 Drawing Sheets

WIRING STRUCTURE, AND FABRICATION METHOD OF THE SAME

This application claims priority from Japanese Patent Application No. 2003-384612 filed Nov. 14, 2003, which is hereby incorporated by reference.

BACKGROUND OF THE INVENTION

1. Field of the Invention

The present invention relates to an electrical wiring structure, such as a planar coil. More particularly, the present invention relates to an electrical wiring structure, such as a planar coil, capable of being also constructed as a multi-layer structure having a reliable insulation, especially a reliable inter-layer insulation, and a fabrication method of the electrical wiring structure. The present invention also relates to an electrical wiring structure, such as a single-layer planar coil, having a reliable insulation.

2. Description of the Related Background Art

In recent years, electronic equipment has been increasingly reduced in the size and thickness. In synchronization therewith, the density of an electrical wiring on a circuit board and the like tends to increase, and various fine wiring arrangements and fabrication methods thereof have been proposed. Such fine wiring is conventionally fabricated by a method in which a metal thin film is formed by thin-film forming techniques, such as a sputtering method, and a wiring pattern is then formed by etching. In such a fabrication method, a fine structure can be formed if the film thickness is thinned, where the cross-sectional area of the wiring decreases and a resistance of the wiring increases. However, there is a lower limit to the thickness of a thin film in the light of electrical properties of electronic components, and a method of forming an electrical wiring having a large aspect ratio is earnestly desired.

The above-discussed situation also applies to electronic equipment having a driving system. Reduction in the size and thickness of a driving portion is desired, as well as reduction in the size and thickness of a magnetic component, such as an inductor and a transformer.

It should be noted that there is a limit to reducing the size of a conventional wound coil in which a wire is wound on a ferrite core. Accordingly, it is necessary to enlarge the cross-sectional area of a coil and increase the turn number of a coil to achieve a large inductance.

Japanese Patent Application Laid-Open No. 5(1993)-198449 describes a method of fabricating a planar coil on a ceramic substrate with paste using a screen printing. By this method, it is possible to print a thick-film coil on the substrate and achieve a planar coil. However, it is necessary to increase the turn number of the coil and decrease a wiring resistance in order to increase a Q-value of a planar inductor or the like. It is further necessary to decrease a gap between wires and increase the thickness of the wire in order to increase the turn number of the coil and decrease the wiring resistance. In doing so, the aspect ratio of a coil of paste formed by the screen printing is likely to increase. Hence, droop due to fluidity of the paste is likely to occur prior to or at the time of sintering, and a short-circuit is likely to occur between adjacent wires, resulting in a decreased reliability of the coil.

Further, Japanese Patent Application Laid-Open No. 2001-250723 (JPALO-2001-250723) describes another example of a coil having two or more layers as a method of increasing a Q-value of a high-frequency coil. In the coil, the aspect ratio is regulated, and an organic material having a relative permittivity of below 5 is formed as an inter-layer insulating layer with a thickness between 20 microns and 100 microns. JPALO-2001-250723 also describes that the turn number of the coil per unit area can be increased.

However, an increase in the aspect ratio of the coil wiring is required to decrease a resistance of the coil wiring. In addition, the thickness of an inter-layer insulating layer should be decreased to enhance the magnetic flux density of a coil. In the method of JPALO-2001-250723, therefore, step coverage of the insulating layer is likely to become bad at the outermost periphery of the coil, and there is a high possibility of occurrence of a short-circuit when another coil or the like is layered on this insulating layer. Thus, there is decreased reliability of the inter-layer insulation.

SUMMARY OF THE INVENTION

According to one aspect of the present invention, there is provided an electrical wiring structure, such as a planar coil, in which a set of wiring of an electrical conductor is formed on an insulating surface of a substrate, a dam-up wall structure, that is electrically disconnected from the wiring, is provided around an outermost peripheral portion of the wiring, and an insulating layer is formed over an area from the wiring to the dam-up wall structure, wherein the dam-up wall structure dams up the insulating layer.

The advantage, as well as others, will be more readily understood in connection with the following detailed description of the preferred embodiments and examples of the invention in connection with the drawings.

DESCRIPTION OF THE PREFERRED EMBODIMENTS

Figure 1A:
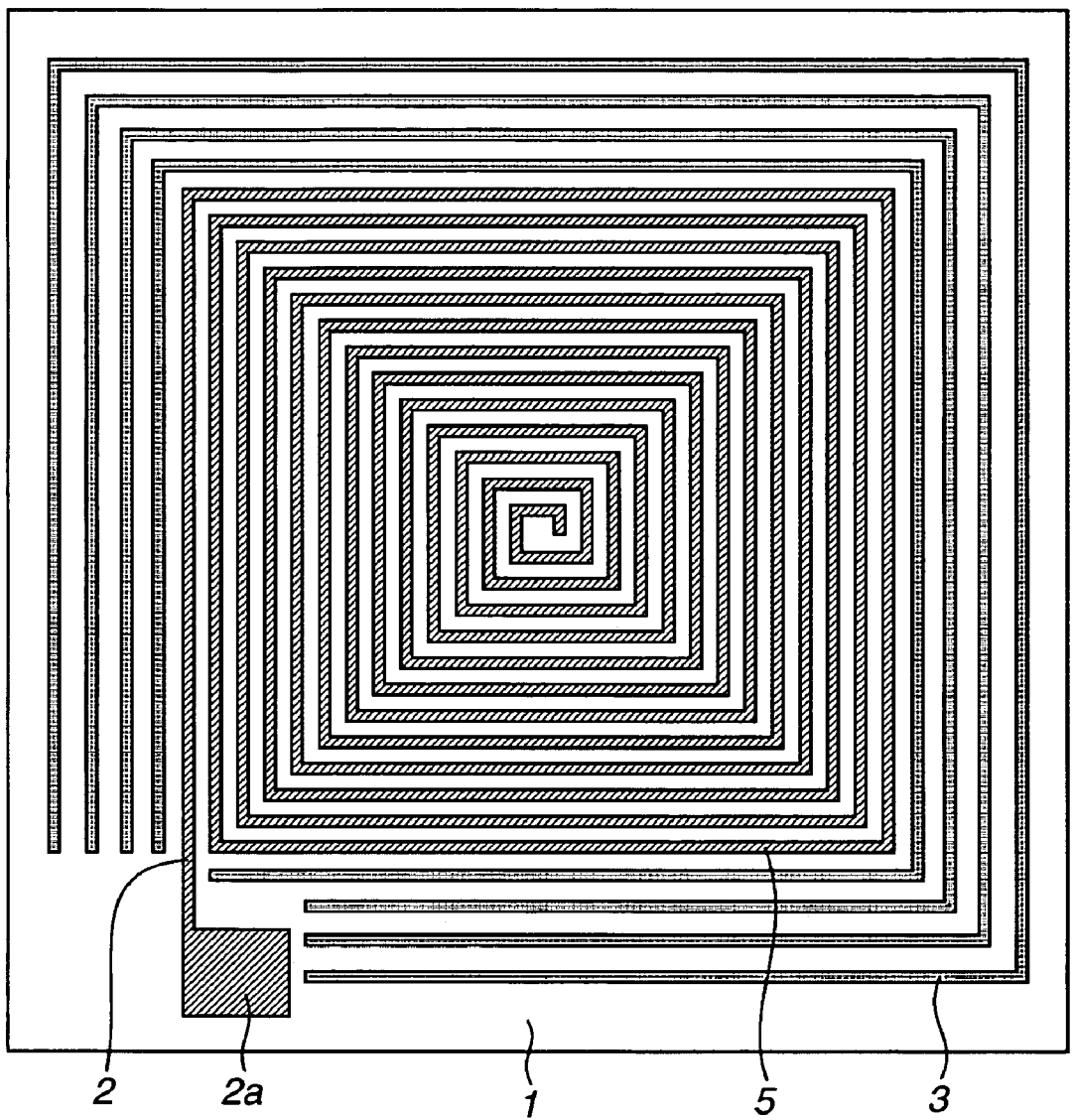
FIG. 1A is a plan view illustrating an embodiment and an example of a planar coil according to the present invention.

Embodiments and examples of an electrical wiring structure of the present invention will be described with reference to FIGS. 1A through 5.

In a typical embodiment of an electrical wiring structure, a set of wiring is constructed as a spiral planar coil composed of an electrical conductor. A dam-up wall structure is provided around the periphery of the wiring such that degradation of step coverage or the like due to fall of an insulating layer can be prevented. The dam-up wall structure is preferably an electrical conductor wall structure that is not electrically connected with the wiring, such as a coil, and is formed of the same material as the wiring or coil. The dam-up wall structure can have any configuration that can serve to dam up the insulating layer and prevent the fall thereof. The dam-up wall structure is not limited to a conductor wall, and can be an insulator wall structure. Further, the dam-up wall structure can have a multi-wall structure, and can be formed continuously encompassing the wiring, though not limited thereto. The dam-up wall structure preferably has a height slightly higher than the height of the wiring or coil.

If the dam-up wall structure is formed of the same conductor as the wiring or coil, it is preferable to form them with copper or the like by electroplating. When forming these structures by electroplating, the width of the conductor wall electrically disconnected from the wiring or coil is preferably equal to the width of the wiring or coil. Further, the dam-up wall structure and the wiring or coil are preferably formed at the same pitch. The dam-up wall structure and the wiring or coil, however, can be formed separately from each other. Further, they can be formed by processes besides electroplating, such as etching, printing or the like.

Further, the wiring structure can have a configuration in which n layers (where n is greater than or equal to two (2)) of sets of wiring or coils are formed with an inter-layer insulating layer therebetween, the dam-up wall structure electrically disconnected from the wiring or coil is provided around an outermost peripheral portion of each of the first-layer to (n−1)-th sets of wiring or coils, and the sets of wiring or coils in different layers are electrically connected through a contact hole formed in each inter-layer insulating layer.

Further, a ratio of a height relative to a width of the wiring or coil is, for example, one (1) or more such that the wiring resistance is reduced. Also in such a structure, the coverage by the insulating layer can be satisfactorily achieved according to the structure of the present invention. The insulating layer acting as the inter-layer insulating layer or the like can be formed of any insulating material, such as an insulating resin and an inorganic material. Acrylic resin, epoxy resin, polyimide resin, benzocyclobutene resin or the like can be used as the insulating resin.

A wiring structure, such as a spiral planar coil, of the present invention can be fabricated by the following fabrication method, for example. The fabrication method includes at least a step (1) of forming an electrically conductive layer on an insulating surface of a substrate, a step (2) of forming an insulating mask layer on the electrically conductive layer, a step (3) of patterning the insulating mask layer to expose the electrically conductive layer at pattern portions of a set of wiring, such as a coil, and a conductive wall structure, a step (4) of simultaneously forming the wiring, and the conductive wall structure, which are not electrically connected with each other, on the electrically conductive layer at the pattern portions of the wiring, and the conductive wall structure, using electroplating, a step (5) of removing the insulating mask layer, a step (6) of patterning the electrically conductive layer, and a step (7) of forming an insulating layer over an area from the wiring to the conductive wall structure. An electrical wiring structure, such as a coil, of the present invention can be readily and accurately fabricated by such a fabrication method.

A wiring structure having a multi-layer structure can be fabricated by the following method, for example. In addition to the steps (1) to (7) as described above, the fabrication method also includes a step (8) of forming at least a contact hole in the insulating layer, a step (9) of forming a second electrically conductive layer on the insulating layer, a step (10) of forming a second insulating mask layer on the second electrically conductive layer, a step (11) of patterning the second insulating mask layer to expose the second electrically conductive layer at a pattern portion of a second set of wiring, such as a coil, and in the contact hole, a step (12) of forming the second set of wiring, and an electrical connecting portion connected to the lower wiring, such as a coil, on the second electrically conductive layer at the pattern portion of the second set of wiring, and in the contact hole, using electroplating, a step (13) of removing the second insulating mask layer, and a step (14) of patterning the second electrically conductive layer. A two-layer wiring structure can be fabricated by this fabrication method. When the steps (1) to (8) are repeated (n−1) times (where n is greater than or equal to three (3)) and thereafter an n-th set of wiring is formed by the steps (9) to (14), an n-layer wiring structure can be fabricated.

According to the present invention, coverage of a set of wiring or a coil with an insulating layer can be reliably achieved since a dam-up wall structure for damming up the insulating layer is provided. Further, in the event that a plurality of sets of wiring or coils are layered, the occurrence of poor coverage can be prevented even if an inter-layer insulating layer is thinned. Thus, there can be provided a wiring structure, such as a planar coil in which plural coils are layered and a highly-reliable inter-layer insulation is achieved, and a fabrication method therefor.

Further, when the wiring, such as a coil, and the dam-up wall structure for damming up the insulating layer are simultaneously formed by electroplating, it is possible to provide a wiring structure, such as a planar coil, in which variation in heights of the wiring is small and the wiring resistance is reduced because of a high aspect ratio of the wiring, and its fabrication method. Furthermore, since reliability of insulation can be enhanced even when the thickness of insulating material is reduced, it is possible to provide a small-sized highly-effective planar coil in which the turn number can be increased and the magnetic flux density can be enlarged, thus increasing a Q-value of a planar inductor or the like.

A detailed description will further be made to a configuration and operation of an embodiment of the present invention.

In FIGS. 1A to 5, reference numeral 1 designates a substrate, reference numeral 2 designates a coil or a first coil, reference numeral 2a designates a pad portion, reference numeral 3 designates a conductive wall, reference numeral 4 designates an insulating resin (an insulating layer), reference numeral 5 designates an outermost peripheral portion of a coil, reference numeral 6 designates a conductive layer, reference numeral 7 designates a mask layer, reference numeral 8 designates a coil pattern, reference numeral 9 designates a pattern of the conductive wall, reference numeral 10 designates a plated layer, reference numeral 11 designates an inter-layer insulating layer, reference numeral 12 designates a second conductive layer, reference numeral 13 designates a contact hole, reference numeral 14 designates a coil in a second layer, reference numeral 15 designates a coil in a third coil, and reference numeral 16 designates a coil in a fourth layer.

Figure 1B:
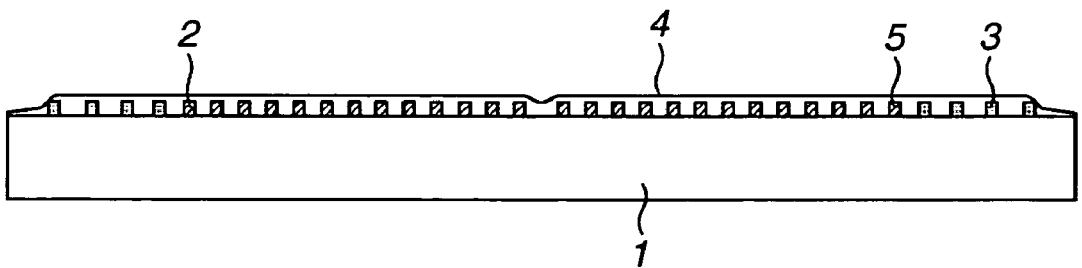
FIG. 1B is a cross-sectional view illustrating the planar coil of FIG. 1A.

In the planar coil of this embodiment, the spiral coil 2 of an electrical conductor is formed on the planar substrate 1 by electroplating, as illustrated in FIGS. 1A and 1B, and there is provided around the outermost peripheral portion 5 of the coil the conductive wall 3 that is electrically disconnected from the coil 2 and is formed of the same material as the coil 2. The insulating resin layer 4 is formed over an area ranging from the coil 2 to the conductive wall 3. The conductive wall 3 is hence present around the outermost peripheral portion 5 of the coil. Therefore, it is possible to prevent reduction of coverage due to the fall of resin on the outermost peripheral portion 5 of the coil at the time when the insulating resin 4 is coated on the coil 2. Virtually no poor coverage occurs even in the case of a coil having a large aspect ratio (i.e., the height of the coil is larger than the width of the coil).

Accordingly, the occurrence of electrical short-circuit can be prevented even when another electrical wiring is formed on the insulating resin 4. It is thus possible to prevent electrical connection (short-circuit) at a place other than a desired electrical connection point, such as the contact hole, even when a second set of wiring or a second coil is formed immediately on the coil 2 through the insulating resin acting as the inter-layer insulating layer. Further, a function of prevention of corrosion can be achieved because the coil is packaged with the insulating resin 4. Furthermore, the cross-sectional area of the wiring can be enlarged due to a high aspect ratio thereof, and a decrease in the wiring resistance is accordingly expected. Moreover, since virtually no poor coverage occurs even if the thickness of the inter-layer insulating layer is not increased, it is possible to reduce the thickness of the inter-layer insulating layer and to attain a planar coil with a large magnetic flux density. It is also possible to prevent a warp due to a stress caused by increase in the thickness of the inter-layer insulating layer.

Further, no electrical connection is present between the conductive wall 3 and the coil 2. Accordingly, no short-circuit appears between lower and upper coils formed by interposing the inter-layer insulating layer therebetween even when coverage of the conductive wall 3 with the insulating resin 4 is not good. Moreover, even when n layers of planar coils are to be formed, an n-th planar coil with a highly reliable inter-layer insulation can be obtained if only a conductive wall is provided around the (n−1)-th coil.

For example, in the event that a planar coil of the present invention is applied to a planar transformer (which has a structure in which a magnetic material is interposed between two coils covered with insulating material, for example), the coil can be electrically insulated from the magnetic material since a conductive portion of the coil is completely sealed.

An example of a method of fabricating the planar coil of this embodiment will be now described with reference to FIGS. 2A to 2F.

Figure 2A:
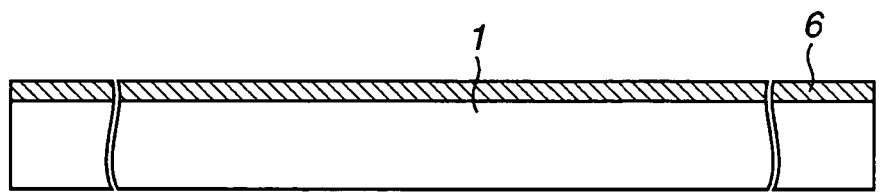
FIGS. 2A to 2F are cross-sectional views illustrating a first embodiment and example of a method of fabricating a planar coil according to the present invention, respectively.
Figure 2B:
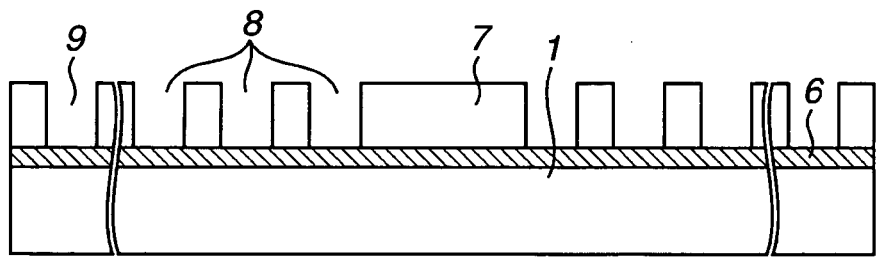

The structure of a substrate used in a step of FIG. 2A will be described. The conductive layer 6 is formed on the planar substrate 1, and the insulating mask layer 7 is further formed, as seen in FIG. 2B. The coil is formed on such a substrate. Any material of metal, semiconductor and insulator can be used as a material of the substrate. When metal is used as the substrate, an insulating layer must be formed on a surface of the metal. Also in the case of semiconductor, an insulating layer needs to be formed on a surface of the semiconductor. Materials of the substrate and an electrode layer for plating (i.e., the conductive layer 6) are selected from materials that are resistant to an electroplating liquid to be used. The mask layer 7 needs to establish insulation at the time of electroplating such that insulation can be maintained between the conductive layer 6 and the plating liquid. Thus, the mask layer 7 is formed of insulating material, such as an inorganic insulating material and an organic insulating material. The mask layer 7 also needs to be resistant to the plating liquid to be used.

Then, as illustrated in FIG. 2B, opening portions of the coil pattern 8 and the pattern 9 of the conductive wall are formed in the mask layer 7. In formation of the opening portions of the coil pattern 8 and the pattern 9 of the conductive wall, the opening portions are formed in the mask layer 7 by a semiconductor photolithography process and an etching process, by which a minute opening can be formed. In the event that the mask layer 7 is formed of photoresist, no etching process is needed. Although the coil pattern 8 can be formed by a process separate from a process of forming the pattern 9 of the conductive wall, the number of processing steps can be reduced in a method of simultaneously forming these patterns 8 and 9.

Figure 2C:
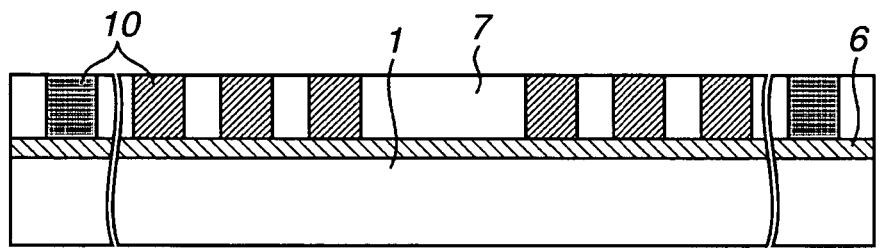

The substrate having the opening portions of the coil pattern 8 and the pattern 9 of the conductive wall is then dipped into the plating liquid. When current is caused to flow between the substrate and an anodic plate by an exterior electrical power source, the plated layer 10 is formed in the coil pattern 8 and the pattern 9 of the conductive wall as illustrated in FIG. 2C. Here, owing to the presence of the pattern 9 of the conductive wall around the periphery of the coil pattern 8, an edge-effect appearing region specific to electroplating (the edge-effect is a phenomenon that the thickness of a plated layer is liable to be thick at the periphery of a pattern) necessarily lies in a region of the pattern 9 of the conductive wall, and variation in heights of the plated layer 10 in the coil pattern 8 is hence reduced. Due to this reduction in the variation, resistance of the coil is made uniform over approximately the entire coil line. Unavailable heat generation can be hence reduced. Here, the coil 2 and the conductive wall 3 are thus fabricated with the same material simultaneously. However, the coil 2 and the conductive wall 3 are not connected to each other.

The thickness of the plated layer 10 can be readily regulated by controlling plating time and plating temperature because the plated layer 10 is formed by deposition of metal ions in a plating bath, that is caused by electrochemical reaction. Here, copper (Cu) or gold (AU) having a low relative resistance is preferably used as the plating metal. It is, however, possible to use other material that is capable of being electroplated.

Figure 2D:
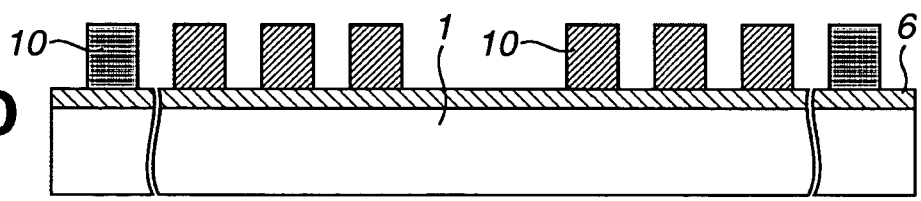

Then, the mask layer 7 is removed as illustrated in FIG. 2D. Organic washing, inorganic washing, ultra-violet-ray ozone ashing, plasma ashing, or the like can be employed as a removing method so long as the substrate 1, the electrode layer 6, and the plated layer 10 are not corroded thereby.

Figure 2E:
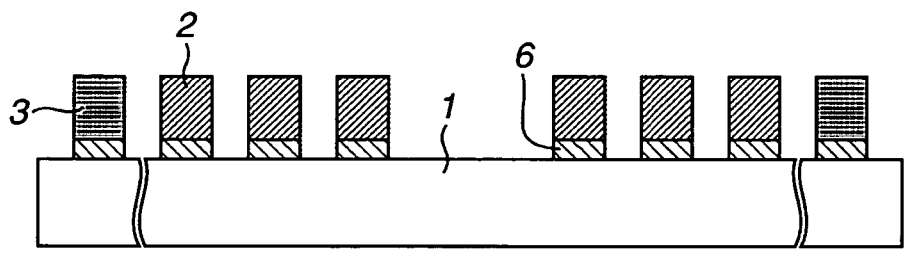

The conductive layer 6 is then patterned as illustrated in FIG. 2E. Either an wet etching or a dry etching can be employed as a patterning method. In the wet etching, it is preferable to avoid an etching liquid that also etches the plated layer 10. However, in the event that the thickness of the conductive layer 6 is much smaller than that of the plated layer 10, it is permissible to use an etching liquid that also etches the plated layer 10. Also in the dry etching, it is preferable to avoid an etching gas that also etches the plated layer 10. However, the same also holds true with an etching gas.

Figure 2F:
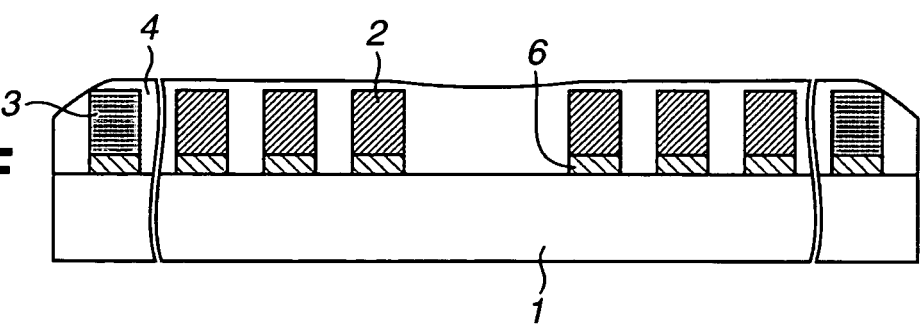

Then, the insulating resin layer 4 is deposited as illustrated in FIG. 2F. It is possible to use spin coating, spray coating, dipping or the like as a coating method. During the coating process, the insulating resin layer 4 on the outermost peripheral portion 5 of the coil does not fall, and occurrence of poor coverage is prevented, since the conductive wall 3 is present around the periphery of the coil 2.

Figure 6:
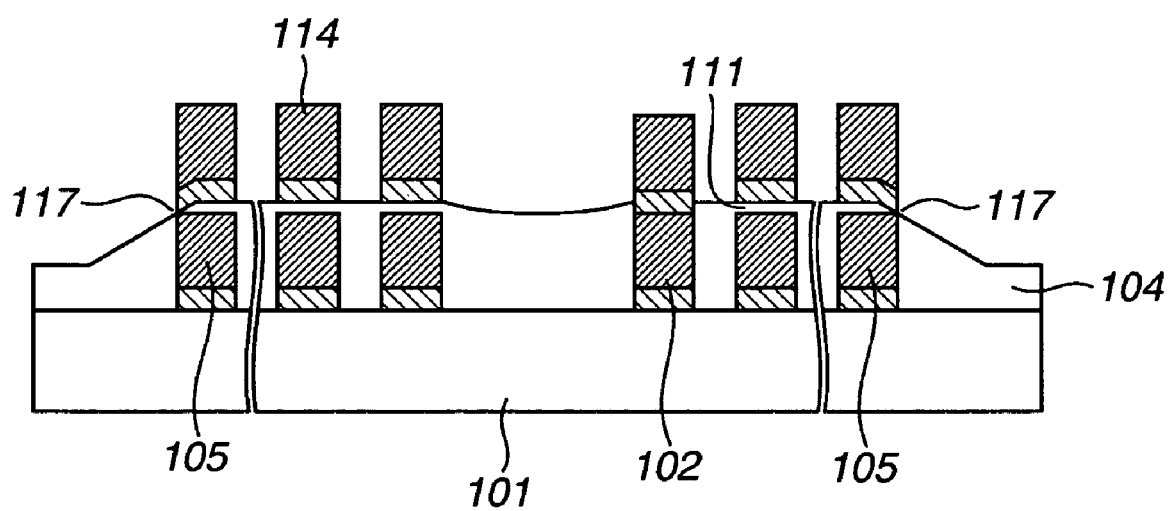
FIG. 6 is a cross-sectional view illustrating a comparative example of a planar coil having a two-layer structure without any conductor wall.

In contrast, where no conductive wall is provided as illustrated in FIG. 6, an insulating resin layer 104 on an outermost peripheral portion 105 of a coil 102 is likely to fall, and a place 117 of poor coverage is likely to appear. Although the poor coverage can be prevented by thickly depositing the insulating resin layer 104 even in a case where no conductive wall is provided, a warp is likely to occur due to occurrence of a large stress of the thickly-formed insulating resin layer 104. Further, when plural coils are to be layered to increase the turn number, the magnetic flux density is likeky to decrease because of a large inter-layer gap caused by the thickly-formed insulating resin layer 104. In FIG. 6, reference numeral 101 designates a substrate, reference numeral 111 designates an inter-layer insulating layer, and reference numeral 114 designates a second-layer coil provided on the first-layer coil 102.

Turning back to FIG. 2F, an opening portion is formed at a desired place or desired places (for example, an innermost end portion of the coil 2, and the pad portion 2a at the outermost periphery illustrated in FIG. 1A) of the insulating resin layer 4. The opening portion is used as a portion for pulling out an electrode. The opening portion is formed in the insulating resin layer 4 by a semiconductor photolithography process and an etching process, by which a minute opening can be formed. In the event that the insulating resin layer 4 is formed of photoresist, no etching process is needed. Acrylic resin, epoxy resin, polyimide resin, benzocyclobutene resin or the like can be used as a material of the insulating resin layer 4.

By the above-discussed processes, the coil 2 is plated on the insulating surface of the planar substrate 1, and there is provided, around the outermost peripheral portion 5 of the coil, the conductive wall 3 that is electrically disconnected from the coil 2 and is formed of the same material as the coil 2. It is thus possible to obtain a single-layer planar coil in which the insulating resin layer 4 is formed over an area from the coil 2 to the conductive wall 3.

In the event that a two-layer planar coil is to be fabricated, the following processes are carried out following the above steps. An example of a fabrication method of the two-layer planar coil will be described with reference to FIGS. 3A to 3E.

Figure 3A:
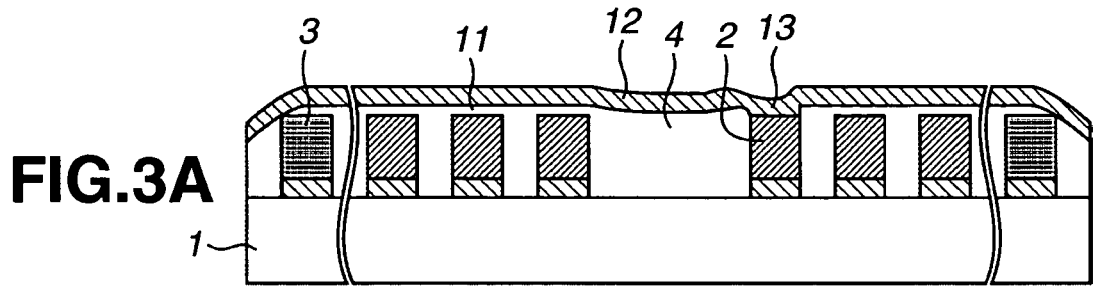
FIGS. 3A to 3E are cross-sectional views of a second embodiment and example of a method of fabricating a planar coil according to the present invention, respectively.

As illustrated in FIG. 3A, the insulating resin layer 4 formed directly on the coil is used as the inter-layer insulating layer 11, and the contact hole 13 is formed therein. The contact hole 13 can be formed in the inter-layer insulating layer 11 by a semiconductor photolithography process and an etching process, by which a minute opening can be formed. In the event that the inter-layer insulating layer 11 is formed of photoresist, no etching process is needed. After that, the conductive layer 12 is formed on the inter-layer insulating layer 11. The conductive layer 12 can also be formed in the contact hole 13.

Figure 3B:
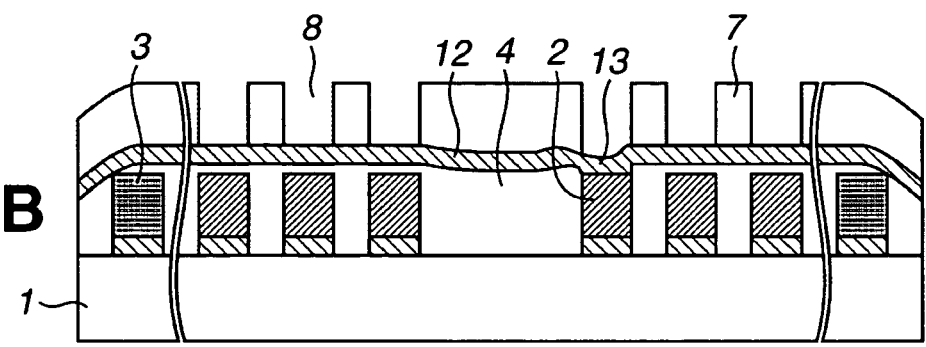

Then, as illustrated in FIG. 3B, an opening portion of the coil pattern 8 is formed in the mask layer 7. A method of forming the opening portion of the coil pattern 8 is the same as that of FIG. 2B. A winding direction of the opening portion of the coil pattern 8 is opposite to that of the first-layer coil 2.

Figure 3C:
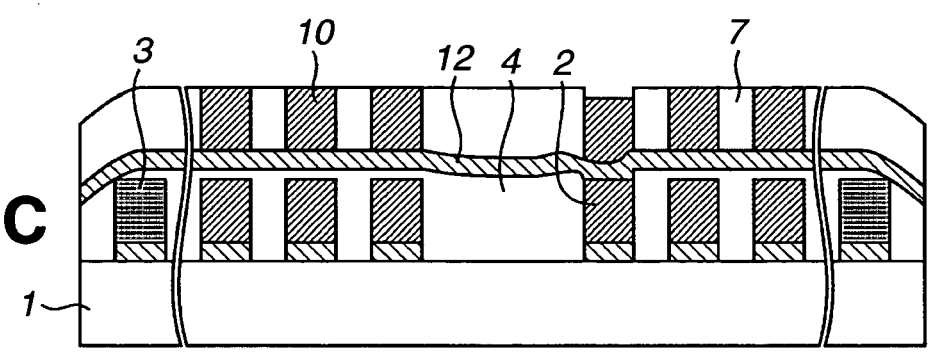

The substrate having the coil pattern 8 is then dipped into a plating liquid. When current is caused to flow between the substrate and an anodic plate by an exterior electrical power source, the plated layer 10 is formed in the coil pattern 8 as illustrated in FIG. 3C. The plated layer 10 is also formed in the contact hole 13, and the plated layer 10 is connected to the first-layer coil 2 through the contact hole 13.

The plating is similar to that described in FIG. 2C. Here, no conductive wall is formed together with the second-layer coil, but a conductive wall may be formed like the first-layer coil 2. Due to the presence of such a conductive wall, the above-mentioned edge-effect can be prevented from appearing at the peripheral portion of the coil, and variation in heights of the plated layer 10 is hence reduced.

Figure 3D:
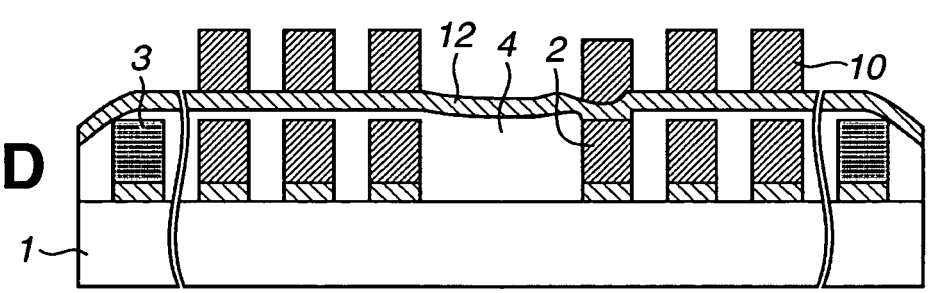

Then, the mask layer 7 is removed as illustrated in FIG. 3D. Organic washing, inorganic washing, ultra-violet-ray ozone ashing, plasma ashing, or the like can be employed as a removing method so long as the substrate 1, the electrode layer 12, and the plated layer 10 are not corroded thereby.

Figure 3E:
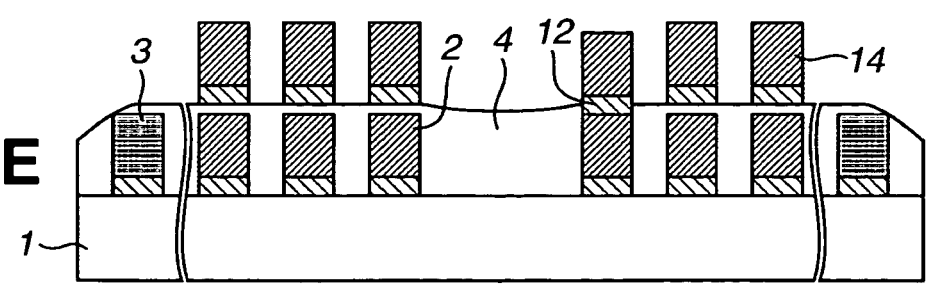

Then, the conductive layer 12 is patterned as illustrated in FIG. 3E. A patterning method is similar to that described in FIG. 2E.

It is thus possible to obtain a two-layer planar coil in which the second-layer plated coil 14 is formed on the inter-layer insulating layer 11, the first-layer plated planar coil 2 is formed on the insulating surface of the planar substrate 1, and electrical connection between the first-layer coil 1 and the second-layer coil 14 is established through the contact hole 13 formed in the inter-layer insulating layer 11.

While the above-obtained planar coil is a complete one, another insulating resin can be deposited over the second-layer coil 14. In such a case, an opening portion may be formed in the insulating resin as a portion for pulling out an electrode.

Description will now be hereinafter made to more specific examples of the present invention.

A first example of a planar coil will be described. The configuration of the coil of this example is substantially the same as that illustrated in FIGS. 1A and 1B.

A fabrication method of the planar coil of this example will be explained with reference to FIGS. 2A to 2F. A silicon wafer of 4 (inch)×4 (inch) was used as the substrate 1, and a silicon nitride layer was deposited to a thickness of 3000 Å by a chemical deposition method to form the insulating surface of the substrate 1. Using an electron beam vapor deposition method, titanium and gold were sequentially deposited to thicknesses of 50 Å and 1500 Å, respectively, to form the electrically-conductive layer 6 on the insulating surface of the substrate 1 (see FIG. 2A).

A novolac type positive photoresist PMER P-GH3000PM Trial-4 (a product name by Tokyo Ohka Kogyo Co., Ltd.) was then coated on the conductive layer 6, and the photoresist was subjected to exposure and development using a semiconductor photolithography. An opening portion of the 45-turn spiral coil pattern 8 with line/space of 30 μm/30 μm and a height of 55 μm was thus formed. Simultaneously with that formation, six (6) opening portions of curved patterns with a pitch of 30 μm and a width of 30 μm were formed at a place 30 μm away from the outermost periphery of the coil pattern 8 to form the pattern 9 of the conductive wall (see FIG. 2B). The coil pattern 8 was not connected to the pattern 9 of the conductive wall. A plurality (52) of sets of the coil pattern 8 and the pattern 9 of the conductive wall were formed on the substrate 1 with the same pattern.

Then, using the substrate 1 with the mask layer 7 of the photoresist having the coil pattern 8 and the pattern 9 of the conductive wall, Cu plating was carried out with the conductive layer 6 being a cathodic electrode. A Cu plating bath containing copper sulfate, sulfuric acid, hydrochloric acid and brightening agent was used, and the plating was conducted at a bath temperature of 25° C. and a cathodic-electrode current density of 2 A/dm². The current flow was stopped at the time when the height of the Cu plated layer 10 reached 50 μm, and the substrate 1 was washed by water and dried (see FIG. 2C).

Here, opening portions of the coil pattern 8 and the pattern 9 of the conductive wall were formed with an approximately uniform width of 30 μm and an approximately uniform pitch of 30 μm, so that the plated layer 10 with an approximately uniform height could be formed in a region of the coil pattern 8. In a region of the pattern 9 of the conductive wall, there was a possibility that the height of the plated layer 10 could become a little higher owing to the edge effect. This phenomenon was, however, preferable for the conductive wall 3. Although the pattern 9 of the conductive wall was formed in a six-fold manner, a configuration of the pattern should not be limited thereto so long as the region of the coil 2 is completely covered with the insulating layer 4 having an approximately uniform thickness. Further, since the width of an opening portion of the pattern 9 of the conductive wall was not so large, much plating material was not consumed thereby. Thus, the plated layer 10 was desirably formed in the region of the coil pattern 8.

The mask layer 7 was then removed using acetone and N,N-dimethylformamide (see FIG. 2D). After that, the conductive layer 6 was patterned by a dry etching using argon as a reactive gas (see FIG. 2E).

Then, an acrylic epoxy type negative photoresist V-259PA/X204 (a product name by Shin-Nittetsu Chemical Co.) was coated by a spin coating, and this photoresist was subjected to exposure and development using a semiconductor photolithography. Opening portions for pulling out an electrode were formed at a start point and an end point of the coil 2, respectively, and the insulating resin 4 was formed by hardening the photoresist at 210° C. The thickness of the insulating resin 4 on the plated layer 10 at this time was 5 μm. The coil 2 was thus completely covered with the insulating resin 4 except the opening portions for pulling out an electrode, and corrosion of the coil due to external environment could be prevented thereby.

It could be confirmed that electrical leak due to poor coverage was not present, by using a conduction tester applied to the outermost peripheral portion 5 of the coil and the start or end point of the coil 2.

A second example of the present invention will now be described. The second example is similar to the first example, but differs in the following ways.

1) While the silicon nitride layer was deposited to a thickness of 3000 Å by the chemical deposition method to form the insulating surface in the first example, a silicon dioxide layer was deposited to a thickness of 3000 Å by a chemical deposition method to form the insulating surface in the second example.

2) While titanium and gold were formed by the electron beam vapor deposition method in the first example, titanium and copper were formed by an electron beam vapor deposition method in the second example.

3) While the novolac type positive photoresist PMER P-GH3000PM Trial-4 (a product name by Tokyo Ohka Kogyo Co., Ltd.) was used in the first example, an acrylic epoxy type negative photoresist V-259PA/X204 (a product name by Shin-Nittetsu Chemical Co.) was used in the second example.

4) While the first mask layer 7 was removed using acetone and N,N-dimethylformamide in the first example, the first mask layer 7 was removed using an alkaline water solution in the second example (see FIG. 2D).

5) While the conductive layer 6 was patterned by the dry etching using argon as a reactive gas in the first example, the conductive layer 6 was patterned by a wet etching using nitric acid, water solution of ammonium persulfate, ammonium fluoride, and hydrofluoric acid solution in the second example (see FIG. 2E).

Figure 4:
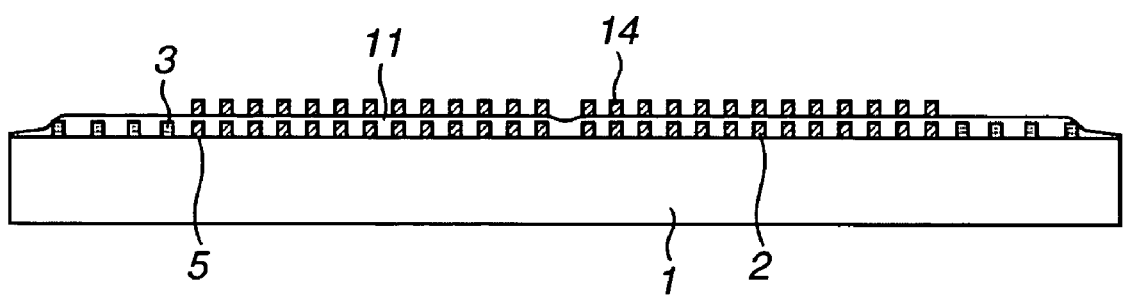
FIG. 4 is a cross-sectional view illustrating a third embodiment and example of a planar coil having a two-layer structure.

A third example of a planar coil will now be described. The configuration of the coil of this example has two layers as illustrated in FIG. 4. Its fabrication method will be described with reference to FIGS. 2A to 2F and FIGS. 3A to 3E.

The fabrication method of the planar coil of this example will be first explained with reference to FIGS. 2A to 2F. A silicon wafer of 4 (inch)×4 (inch) was used as the substrate 1, and a silicon dioxide layer was deposited to a thickness of 3000 Å by a chemical deposition method to form the insulating surface of the substrate. Using an electron beam vapor deposition method, titanium and copper were sequentially deposited to thicknesses of 50 Å and 1500 Å, respectively, to form the conductive layer 6 on the insulation layer of the substrate 1 (see FIG. 2A).

An acrylic epoxy type negative photoresist V-259PA/X204 (a product name by Shin-Nittetsu Chemical Co.) was then coated on the conductive layer 6, and the photoresist was subjected to exposure and development using a semiconductor photolithography. An opening portion of the 45-turn spiral coil pattern 8 with line/space of 30 μm/30 μm and a height of 55 μm was thus formed. Simultaneously with that formation, six (6) opening portions of curved patterns with a pitch of 30 μm and a width of 30 μm were formed at a place 30 μm away from the outermost periphery of the coil pattern 8 to form the pattern 9 of the conductive wall (see FIG. 2B). The coil pattern 8 was not connected to the pattern 9 of the conductive wall. A plurality (52) of sets of the coil pattern 8 and the pattern 9 of the conductive wall were formed on the substrate 1 with the same pattern.

Then, using the substrate 1 with the mask layer 7 of the photoresist having the coil pattern 8 and the pattern 9 of the conductive wall, Cu plating was carried out with the conductive layer 6 being a cathodic electrode. A Cu plating bath containing copper sulfate, sulfuric acid, hydrochloric acid and brightening agent was used, and the plating was conducted at a bath temperature of 25° C. and a cathodic-electrode current density of 2 A/dm$^2$. The current flow was stopped at the time when the height of the Cu plated layer 10 reached 50 μm, and the substrate 1 was washed by water and dried (see FIG. 2C).

The mask layer 7 was then removed using an alkaline water solution (see FIG. 2D). After that, the conductive layer 6 was patterned by a wet etching using nitric acid, water solution of ammonium persulfate, ammonium fluoride, and hydrofluoric acid solution (see FIG. 2E).

Then, an acrylic epoxy type negative photoresist V-259PA/X204 (a product name by Shin-Nittetsu Chemical Co.) was coated by a spin coating, and this photoresist was subjected to exposure and development using a semiconductor photolithography. An opening portion for pulling out an electrode was formed at an outermost peripheral end portion of the coil, and simultaneously the inter-layer insulating layer 11 with the contact hole 13 was formed above an innermost portion of the coil. Here, the photoresist was hardened at 210° C., and chemical resistance of the inter-layer insulating layer 11 was improved.

A resistance of 8.0 Ω was measured by using a conduction tester applied to the opening portion for pulling out an electrode on the outermost peripheral end portion of the coil and the contact hole 13. Further, it could be confirmed that electrical leak due to poor coverage was not present, by using a conduction tester applied to the outermost peripheral portion of the coil, and the opening portion for pulling out an electrode on the outermost peripheral end portion of the coil or the start point of the coil or the contact hole 13.

With the fabrication of the first-layer coil being completed at this stage, a fabrication of the second-layer coil was carried out by succeeding steps. Using a electron beam vapor deposition method, titanium and copper were sequentially deposited to thicknesses of 50 Å and 1500 Å, respectively, to form the electrically-conductive layer 12 on a surface of the substrate in which the first-layer coil was formed. Here, the conductive layer 12 was also formed in the contact hole 13 (see FIG. 3A).

An acrylic epoxy type negative photoresist V-259PA/X204 (a product name by Shin-Nittetsu Chemical Co.) was then coated on the conductive layer 12, and the photoresist was subjected to exposure and development using a semiconductor photolithography. An opening portion of the 45-turn spiral coil pattern 8 with line/space of 30 μm/30 μm and a height of 55 μm was thus formed (see FIG. 3B). A plurality (52) of coil patterns 8 were formed on the first-layer coil 2 through the inter-layer insulating layer 11.

Then, using the substrate 1 with the mask layer 7 of the photoresist having the coil pattern 8, Cu plating was carried out with the conductive layer 12 being a cathodic electrode. A Cu plating bath containing copper sulfate, sulfuric acid, hydrochloric acid and brightening agent was used, and the plating was conducted at a bath temperature of 25° C. and a cathodic-electrode current density of 2 A/dm$^2$. The current flow was stopped at the time when the height of the Cu plated layer 10 reached 50 μm. At this moment, the plated layer 10 was also formed in the contact hole 13, and the plated layer 10 was electrically connected to the first-layer coil 2 through the contact hole 13. Thereafter, the substrate 1 was washed by water and dried (see FIG. 3C).

The mask layer 7 was then removed using an alkaline water solution (see FIG. 3D). Here, the inter-layer insulating layer 11 was not corroded by the alkaline water solution and only the mask layer 7 could be selectively removed, because the inter-layer insulating layer 11 was hardened at 210° C. and the conductive layer 12 could function as a protective layer.

Then, the conductive layer 12 was patterned by a wet etching using nitric acid, water solution of ammonium persulfate, ammonium fluoride, and hydrofluoric acid solution (see FIG. 3E).

A resistance of 8.0 Ω was measured by using a conduction tester applied to the plated layer 10 on the contact hole 13 of the second-layer coil 14 and the outermost peripheral portion of the second-layer coil 14. Further, a resistance of 16.0 Ω was measured by using a conduction tester applied to the opening portion for pulling out an electrode on the outermost peripheral end portion of the first-layer coil 2 and the outermost peripheral portion of the second-layer coil 14, and it could be confirmed thereby that short-circuit between the first-layer coil 2 and the second-layer coil 14 due to poor coverage by the inter-layer insulating layer 11 was not present.

Figure 5:
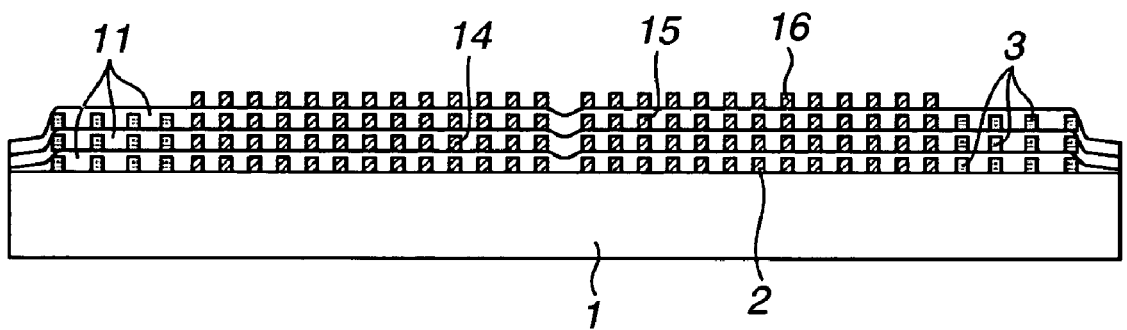
FIG. 5 is a cross-sectional view illustrating a fourth embodiment and example of a planar coil having a four-layer structure.

A fourth example of a planar coil will now be described. The configuration of the coil of this example has four layers as illustrated in FIG. 5, and its fabrication method will be described. A fabrication method of the first-layer coil is similar to that of the third example. In succeeding steps, second-layer and third-layer coils were fabricated. The third-layer coil was formed by repeating fabrication steps of the second-layer coil, which are as follows.

Using an electron beam vapor deposition method, titanium and copper were sequentially deposited on a surface of the substrate with the first-layer coil formed therein to thicknesses of 50 Å and 1500 Å, respectively, to form the electrically-conductive layer 12. Here, the conductive layer 12 was also formed in the contact hole 13.

An acrylic epoxy type negative photoresist V-259PA/X204 (a product name by Shin-Nittetsu Chemical Co.) was then coated on the conductive layer 12, and the photoresist was subjected to exposure and development using a semiconductor photolithography. An opening portion of the 45-turn spiral coil pattern 8 with line/space of 30 μm/30 μm and a height of 55 μm was thus formed. Simultaneously with that formation, six (6) opening portions of curved patterns with a pitch of 30 μm and a width of 30 μm were formed at a place 30 μm away from the outermost periphery of the coil pattern 8 to form the pattern 9 of the conductive pattern. A plurality (52) of the coil patterns 8 were formed on the inter-layer insulating layer 11 immediately over the lower coil (here the first-layer coil). The winding direction of the opening portion of the coil pattern 8 was opposite to the winding direction of the first-layer coil 2.

Then, using the substrate 1 with the mask layer 7 of the photoresist having the coil pattern 8 and the pattern 9 of the conductive wall, Cu plating was carried out with the conductive layer 12 being a cathodic electrode. A Cu plating bath containing copper sulfate, sulfuric acid, hydrochloric acid and brightening agent was used, and the plating was conducted at a bath temperature of 25° C. and a cathodic-electrode current density of 2 A/dm$^2$. The current flow was stopped at the time when the height of the Cu plated layer 10 reached 50 μm. Here, the plated layer 10 was also grown in the contact hole 13, and was electrically connected to the first-layer coil 2 through the contact hole 13. After that, the substrate 1 was washed by water and dried.

The mask layer 7 was then removed using an alkaline water solution. Here, the inter-layer insulating layer 11 was not corroded by the alkaline water solution and only the mask layer 7 could be selectively removed, because the inter-layer insulating layer 11 was hardened at 210° C. and the conductive layer 12 could function as a protective layer.

Then, the conductive layer 6 was patterned by a wet etching using nitric acid, water solution of ammonium persulfate, ammonium fluoride, and hydrofluoric acid solution.

Then, an acrylic epoxy type negative photoresist V-259PA/X204 (a product name by Shin-Nittetsu Chemical Co.) was coated by a spin coating, and this photoresist was subjected to exposure and development using a semiconductor photolithography. The inter-layer insulating layer 11 with an opening portion provided on the opening portion for pulling out an electrode for the first-layer coil and the contact hole 13 formed at a portion for connecting to the third-layer coil was thus formed. Here, the inter-layer insulating layer 11 was hardened at 210° C., and chemicals-resistance of the inter-layer insulating layer 11 was improved. The second-layer coil 14 could be thus formed.

A resistance of 16.0 Ω was measured by using a conduction tester applied to the opening portion for pulling out an electrode on the outermost peripheral end portion of the first-layer coil 2 and the outermost peripheral portion of the second-layer coil 14, and it could be confirmed that short-circuit between the first-layer coil 2 and the second-layer coil 14 due to poor coverage by the inter-layer insulating layer 11 was not present.

The third-layer coil 15 was fabricated by repeating the same steps as those of the second-layer coil 14 as discussed above. The contact hole 13 was provided at the outermost peripheral end portion of the second-layer coil 14 and the third-layer coil 15 because the second-layer coil 14 and the third-layer coil 15 were connected to each other at their outermost peripheries. The winding direction of the third-layer coil 15 was opposite to the winding direction of the second-layer coil 14. A resistance was likewise measured by a conduction tester, and it could be confirmed that short-circuit between the respective coil layers due to poor coverage was not present.

The fourth-layer coil 16 was successively fabricated by the following steps. Using an electron beam vapor deposition method, titanium and copper were sequentially deposited on a surface of the substrate with the third-layer coil formed therein to thicknesses of 50 Å and 1500 Å, respectively, to form the electrically-conductive layer 12. Here, the conductive layer 12 was also formed in the contact hole 13.

An acrylic epoxy type negative photoresist V-259PA/X204 (a product name by Shin-Nittetsu Chemical Co.) was then coated on the conductive layer 12, and the photoresist was subjected to exposure and development using a semiconductor photolithography. An opening portion of the 45-turn spiral coil pattern 8 with line/space of 30 μm/30 μm and a height of 55 μm was thus formed. A plurality (52) of the coil patterns 8 were formed on the inter-layer insulating layer 11 immediately over the third-layer coil. The winding direction of the opening portion of the coil pattern 8 is opposite to the winding direction of the third-layer coil 15.

Then, using the substrate 1 with the mask layer 7 of the photoresist having the coil pattern 8, Cu plating was carried out with the conductive layer 12 being a cathodic electrode. A Cu plating bath containing copper sulfate, sulfuric acid, hydrochloric acid and brightening agent was used, and the plating was conducted at a bath temperature of 25° C. and a cathodic-electrode current density of 2 A/dm$^2$. The current flow was stopped at the time when the height of the Cu plated layer 10 reached 50 μm. Here, the plated layer 10 was also grown in the contact hole 13, and was electrically connected to the third-layer coil 15 through the contact hole 13. After that, the substrate 1 was washed by water and dried.

The mask layer 7 was then removed using an alkaline water solution. Here, the inter-layer insulating layer 11 was not corroded by the alkaline water solution and only the mask layer 7 could be selectively removed, because the inter-layer insulating layer 11 was hardened at 210° C. and the conductive layer 12 could function as a protective layer.

Then, the conductive layer 12 was patterned by a wet etching using nitric acid, water solution of ammonium persulfate, ammonium fluoride, and hydrofluoric acid solution. When a resistance was likewise measured by a conduction tester, it could be confirmed thereby that short-circuit between the respective coil layers due to poor coverage was not present.

The above-discussed examples are all directed to planar coils, but it is also possible to construct a wiring structure in which a desired set of wiring is provided within a dam-up wall structure, such as a conductive wall, for increasing reliability of coverage by an insulating layer, such as an insulating resin. Further, a wiring structure having a multilayer structure as illustrated in FIG. 4 or 5 can also be constructed according to the present invention. In such a structure, plural sets of wiring in respective layers can be electrically connected to each other through a contact hole or contact holes formed at an appropriate place or appropriate places.

While the present invention has been described with respect to what is presently considered to be the preferred embodiments and examples, it is to be understood that the invention is not limited to the disclosed embodiments and examples. The present invention is intended to cover various modifications and equivalent arrangements included within the spirit and the scope of the appended claims.

What is claimed is:

1. An electrical wiring structure comprising:
    a substrate, said substrate having an insulating surface;
    a set of wiring, said set of wiring being formed of an electrical conductor, and being formed on said insulating surface of said substrate;
    a dam-up wall structure, said dam-up wall structure being electrically disconnected from said set of wiring, and being provided around an outermost peripheral portion of said set of wiring; and
    an insulating layer, said insulating layer being formed over an area from said set of wiring to said dam-up wall structure, wherein said dam-up wall structure dams up the insulating layer.

2. An electrical wiring structure according to claim 1, wherein said set of wiring is constructed as a spiral planar coil formed of an electrical conductor.

3. An electrical wiring structure according to claim 1, wherein said dam-up wall structure is formed of the same material as said set of wiring.

4. An electrical wiring structure according to claim 3, wherein said set of wiring and said dam-up wall structure are formed by electroplating.

5. An electrical wiring structure according to claim 3, wherein said set of wiring has a configuration in which first-layer to n-th-layer sets of wiring, with n being greater than or equal to two, are formed with an inter-layer insulating layer, said inter-layer insulating layer being formed of the same material as said insulating layer and being interposed between said sets of wiring, wherein said dam-up wall structure is provided around the outermost peripheral portion of each of said first-layer to (n−1)-th-layer sets of wiring, and wherein said first-layer to n-th-layer sets of wiring are electrically connected through a contact hole formed in each inter-layer insulating layer.

6. A fabrication method of a wiring structure, said method comprising:
    a first step of forming an electrically conductive layer on an insulating surface of a substrate;
    a second step of forming an insulating mask layer on the electrically conductive layer;
    a third step of patterning the insulating mask layer to expose the electrically conductive layer at a pattern portion of a first set of wiring and a pattern portion of a conductive wall structure;
    a fourth step of simultaneously forming the first set of wiring and the conductive wall structure, which are electrically disconnected from each other, on the electrically conductive layer at the pattern portion of the first set of wiring and the pattern portion of the conductive wall structure, respectively, using electroplating;
    a fifth step of removing the insulating mask layer;
    a sixth step of patterning the electrically conductive layer; and
    a seventh step of forming an insulating layer over an area from the first set of wiring to the conductive wall structure.

7. A fabrication method according to claim 6, further comprising:
    an eighth step of forming at least one contact hole in the insulating layer formed in said seventh step;
    a ninth step of forming a second electrically conductive layer on the insulating layer;
    a tenth step of forming a second insulating mask layer on the second electrically conductive layer;
    an eleventh step of patterning the second insulating mask layer to expose the second electrically conductive layer at a pattern portion of a second set of wiring and in the at least one contact hole;

a twelfth step of forming the second set of wiring, and an electrical connecting portion for connecting the second set of wiring to the first set of wiring, on the second electrically conductive layer at the pattern portion of the second set of wiring and in the contact hole, using electroplating;

a thirteenth step of removing the second insulating mask layer; and a fourteenth step of patterning the second electrically conductive layer.

8. A fabrication method according to claim 7, wherein said first to eighth steps are repeated (n−1) times, with n being greater than or equal to three, and wherein an n-th set of wiring is formed by said ninth to fourteenth steps to fabricate an n-layer wiring structure.

9. A fabrication method according to claim 6, wherein the set of wiring is constructed as a spiral planar coil formed of an electrical conductor.

* * * * *